US009097952B2

(12) United States Patent
Li et al.

(10) Patent No.: US 9,097,952 B2
(45) Date of Patent: Aug. 4, 2015

(54) ARRAY SUBSTRATE AND LIQUID CRYSTAL DISPLAY DEVICE

(71) Applicant: BOE TECHNOLOGY GROUP CO., LTD., Beijing (CN)

(72) Inventors: Mingchao Li, Beijing (CN); Jiaoming Lu, Beijing (CN); Jaegeon You, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 45 days.

(21) Appl. No.: 14/124,953

(22) PCT Filed: Nov. 15, 2012

(86) PCT No.: PCT/CN2012/084697
§ 371 (c)(1),
(2) Date: Dec. 9, 2013

(87) PCT Pub. No.: WO2013/127198
PCT Pub. Date: Sep. 6, 2013

(65) Prior Publication Data
US 2014/0111728 A1 Apr. 24, 2014

(30) Foreign Application Priority Data

Feb. 27, 2012 (CN) .......................... 2012 1 0047869

(51) Int. Cl.
G02F 1/1337 (2006.01)
G02F 1/1362 (2006.01)
H01L 27/12 (2006.01)
G02F 1/1343 (2006.01)

(52) U.S. Cl.
CPC .... *G02F 1/136286* (2013.01); *G02F 1/133707* (2013.01); *G02F 1/134363* (2013.01); *H01L27/124* (2013.01); *G02F 1/134309* (2013.01); *G02F 1/134327* (2013.01); *G02F 2001/134318* (2013.01)

(58) Field of Classification Search
CPC .................... G02F 1/134363; G02F 1/133707; G02F 1/134327; G02F 1/134309
See application file for complete search history.

(56) References Cited

U.S. PATENT DOCUMENTS

2007/0103609 A1 5/2007 Kang et al.
2009/0207365 A1 8/2009 Lee et al.
(Continued)

FOREIGN PATENT DOCUMENTS

CN 101515097 A 8/2009
CN 102629061 A 8/2012
(Continued)

OTHER PUBLICATIONS

International Preliminary Report on Patentability for International Application No. PCT/CN2012/084697 dated Sep. 2, 2014, 7pgs.
International Search Report for International Application No. PCT/CN2012/084697, 11pgs.
(Continued)

Primary Examiner — Phu Vu

(57) ABSTRACT

An array substrate and a liquid crystal display device adopt a four-domain electrode structure and have advantages of improving the gradient of a V-T curve and contrast, achieving ideal response time, and the like. The array substrate comprises gate lines, data lines and pixel units defined by the gate lines and the data lines. Pixel electrodes (10) and common electrodes (11) arranged on the same layer are formed in the pixel units. Both the common electrodes (11) and the pixel electrodes (10) adopt a comb structure, and comb teeth of the common electrodes (11) and comb teeth of the pixel electrodes (10) are alternately arranged. Each comb tooth of the comb structure is divided into an upper comb tooth (13) and a lower comb tooth (14) in different directions by a node (12). All the upper comb teeth (13) are parallel to each other, and all the lower comb teeth (14) are parallel to each other. For a pixel electrode (10) and a common electrode (11) that are neighboring each other, a spacing (151) between two upper comb teeth (13) is unequal to a spacing (152) between two lower comb teeth (14).

10 Claims, 7 Drawing Sheets

(56) References Cited

U.S. PATENT DOCUMENTS

2011/0304528 A1  12/2011  Murata et al.
2014/0111728 A1  4/2014   Li et al.

FOREIGN PATENT DOCUMENTS

| | | |
|---|---|---|
| CN | 102282504 A | 12/2012 |
| JP | 2000-098410 | 7/2000 |
| KR | 20080100903 A | 11/2008 |

OTHER PUBLICATIONS

First Office Action issued by the Chinese Patent Office for Chinese Patent Application No. 201210047869.2 dated Feb. 14, 2014, 5pgs.
English translation of First Office Action issued by the Chinese Patent Office for Chinese Patent Application No. 201210047869.2 dated Feb. 14, 2014, 4 pgs.
English translation of Chinese Patent No. 101515097, 34pgs.
English translation of Chinese Patent No. 102282504, 45pgs.
English translation of Chinese Patent No. 102629061, 22pgs.
English translation of Korean Patent No. 10-2008-0100903, 17pgs.

ARRAY SUBSTRATE AND LIQUID CRYSTAL DISPLAY DEVICE

CROSS REFERENCE TO RELATED APPLICATIONS

This application is based on International Application No. PCT/CN2012/084697 filed on Nov. 15, 2012, which claims priority to Chinese National Application No. 201210047869.2 filed on Feb. 27, 2012, the contents of which are incorporated herein by reference.

TECHNICAL FIELD

Embodiments of the present invention relate to an array substrate and a liquid crystal display device.

BACKGROUND

Liquid crystal displays belong to one kind of flat panel displays that are most widely used at present, and have characteristics of low power consumption, thin profile, light weight, low drive voltage, etc. With the development of liquid crystal flat panel display technologies, the high-end liquid crystal displays are in the developing progress toward the direction of high contrast, increased gradient of a V-T (voltage-transmittance) curve, fast response, etc.

A VA (Vertical Alignment) mode liquid crystal display panel comprises: an array substrate and a color filter substrate that are assembled together to form a cell, and a liquid crystal layer between the two substrates; liquid crystal molecules in the liquid crystal layer are aligned in a vertical mode. When no voltage is applied, liquid crystal molecules are aligned perpendicular to the substrate surface; and when a turn-on voltage is applied, an electric field is established between a pixel electrode and a common electrode. Under the action of the electric field, liquid crystal molecules are rotated and turn to a direction perpendicular to the electric field to align; namely, the arranging mode of the liquid crystal molecules is changed from a vertical mode to a horizontal mode, so that a part of light exit from a polarization analyzer to gain a brightstate display. A TBA (Transverse Bend Alignment) mode is a VA mode in which a horizontal electric field and a vertical electric field are mixed in a liquid crystal display panel.

SUMMARY

According to the embodiments of the invention, there are provided an array substrate and a liquid crystal display device with a four-domain electrode structure, which has advantages of increased gradient of a V-T (voltage-transmittance) curve and contrast, relatively ideal response time, etc.

In one aspect of the invention, there is provided an array substrate, comprising: a plurality of gate lines, a plurality of data lines and a plurality of pixel units defined by the gate lines and the data lines; each of the pixel units comprises a pixel electrode and a common electrode that are provided on a same layer; the common electrode and the pixel electrode each have a comb-shaped structure, and comb teeth of the common electrode and comb teeth of the pixel electrode are disposed alternately; each comb tooth of the comb-shaped structure is divided into an upper comb tooth and a lower comb tooth in different directions at a junction, and all of upper comb teeth are parallel to one another, all of lower comb teeth are parallel to one another; for the pixel electrode and common electrode that are adjacent, a space between two upper comb teeth and a space between two lower comb teeth are unequal.

In another aspect of the invention, there is provided a liquid crystal display device, comprising the above array substrate.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

Figure 1:
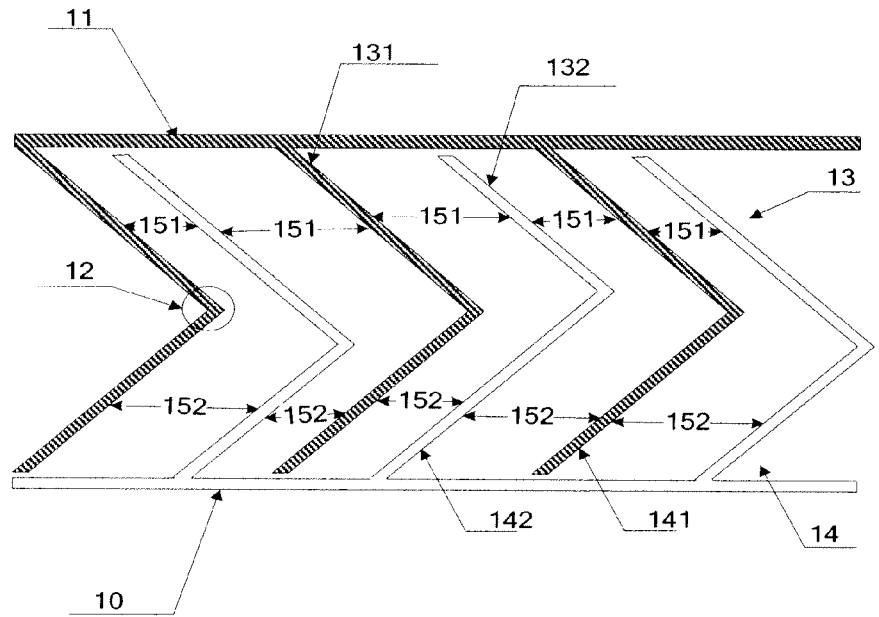
FIG. 1 to FIG. 11 are first to eleventh structurally schematic views illustrating a pixel unit of an array substrate provided by an embodiment of the invention.

Reference Numerals: 10: pixel electrode; 11: common electrode; 12: junction; 13: upper comb tooth; 14: lower comb tooth; 131: upper comb tooth of the pixel electrode; 132: upper comb tooth of the common electrode; 141: lower comb tooth of the pixel electrode; 142: lower comb tooth of the common electrode; 151: space between two upper comb teeth; 152: space between two lower comb teeth; 153: space between two adjacent upper comb teeth of the pixel electrode; 154: space between two adjacent upper comb teeth of the common electrode; 155: space between two adjacent lower comb teeth of the pixel electrode; 156: space between two adjacent lower comb teeth of the common electrode; 16: regular junction; 17: irregular junction.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

Unless otherwise defined, the technical terminology or scientific terminology used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, a term "a," "an," or the like does not indicate limitation in number, but specifies the presence of at least one. A term "connection," "couple," or the like is not limited to physical or mechanical connection, but can comprise electrical connection, whether directly or indirectly. "Upper," "lower," "left," "right" or the like is only used to describe a relative position relationship, and when an absolute position of the described object is changed, the relative position relationship might also be changed accordingly.

An embodiment of the invention provides an array substrate. As illustrated in FIG. 1, the array substrate comprises: a plurality of gate lines, a plurality of data lines and a plurality of pixel units that are defined by the gate lines and the data lines and are arranged in an array form; in each of the pixel units a pixel electrode 10 and a common electrode 11 provided on the same layer are formed. The common electrode 11 and the pixel electrode 10 each have a comb-shaped structure, and the comb teeth of the common electrode 11 and the comb teeth of the pixel electrode 10 are disposed alternately. Each comb tooth of the comb-shaped structure is divided into an upper comb tooth 13 and a lower comb tooth 14 in different directions at a junction 12; all of the upper comb teeth 13 are parallel to one another, and all of the lower comb teeth 14 are parallel to one another. The upper comb teeth 13 comprise the upper comb teeth 132 of the common electrode and the upper comb teeth 131 of the pixel electrode. The lower comb teeth 14 comprise the lower comb teeth 142 of the common electrode and the lower comb teeth 141 of the pixel electrode. For a pixel electrode 10 and a common electrode 11 that are adjacent to each other, the space 151 between two upper comb teeth 13 and the space 152 between two lower comb teeth 14 are unequal.

The above array substrate has a four-domain electrode structure, in which, the pixel electrode 10 and the common electrode 11 are provided on the same layer and each have a comb-shaped structure, the comb teeth of the common electrode 11 and the comb teeth of the pixel electrode 10 are disposed alternately, and each of the comb teeth is divided into an upper comb tooth 13 and a lower comb tooth 14 in different directions at its junction 12. All of the upper comb teeth 13 have the same direction and are parallel to one another; all of the lower comb teeth have the same direction and are parallel to one another. In each pair of the pixel electrode 10 and the common electrode 11 adjacent to each other, the space 151 between two upper comb teeth 13 and the space 152 between two lower comb teeth 14 are unequal.

It is to be noted that, because the common electrode and the pixel electrode are in a comb shape and each of the comb teeth is divided into an upper comb tooth and a lower comb tooth in different directions at a junction, the electrode strips for the pixel electrode have two directions, and the electrode strips for the common electrode have two directions, so the structure are called as four-domain electrode. "Same layer" refers to a layer of thin film made of for example indium tin oxide, and provision on the same layer, which is related to at least two patterns, refers to such a structure in which the at least two patterns are provided on the same layer of thin film. For example, the at least two patterns are formed by one layer of thin film made of the same material through a patterning process. In embodiments of the invention, the comb-shaped structure of the common electrode serves as one pattern, and the comb-shaped structure of the pixel electrode serves as another pattern.

Figure 5:
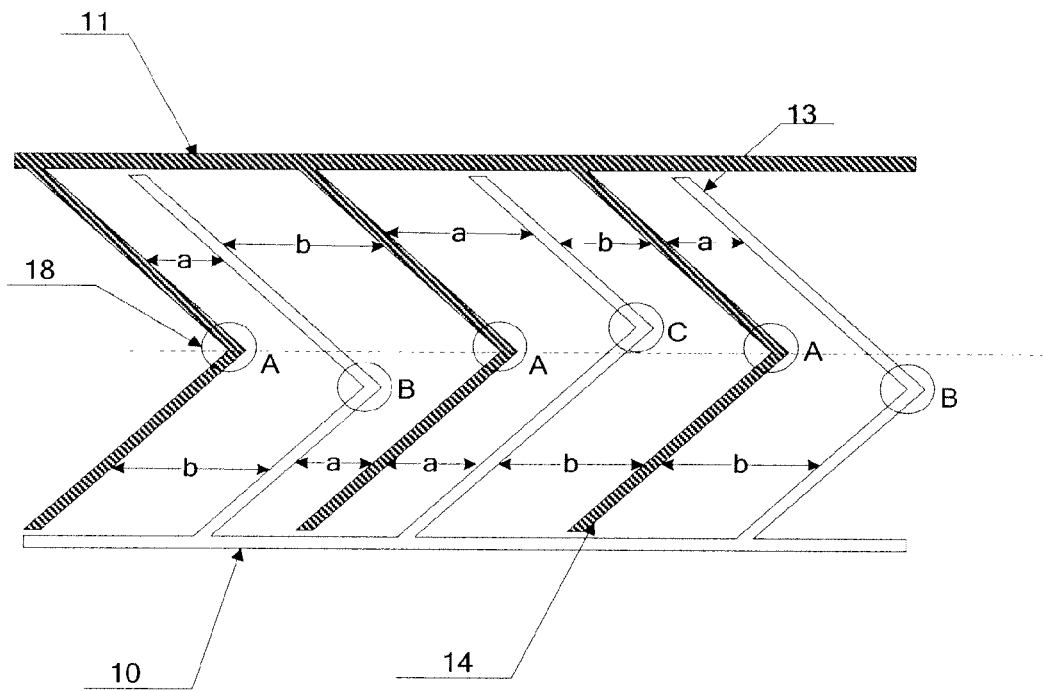

Preferably, with reference to FIG. 5, the case in which the space 151 between two upper comb teeth 13 and the space 152 between two lower comb teeth 14 are unequal may comprise: the space 151 between two upper comb teeth 13 has a first space value, and the space 152 between two lower comb teeth 14 has a second space value; or, the space 151 between two upper comb teeth 13 has the second space value, the space 152 between two lower comb teeth 14 has the first space value. The first space value and the second space value are unequal to each other.

Figure 2:
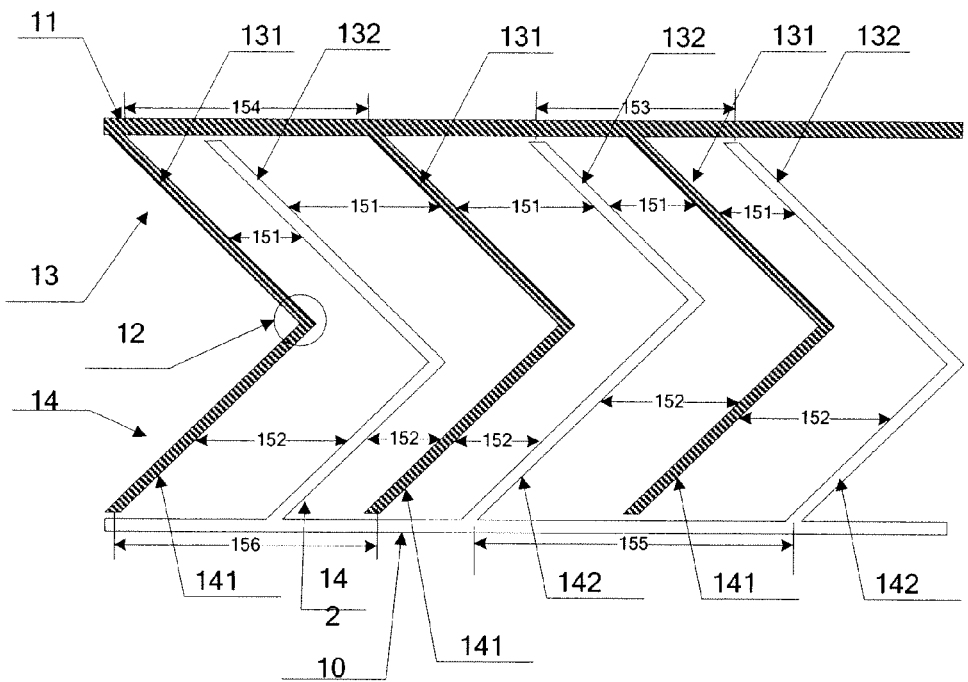

As illustrated in FIG. 5, for example, the first space value is a, and the second space value is b. With reference to FIG. 2, if the space 151 between two upper comb teeth 13 is a, then accordingly, the space 152 between two lower comb teeth 14 is b. If the space 151 between two upper comb teeth 13 is b, then accordingly, the space 152 between two lower comb teeth 14 is a.

It is to be noted that, "a" and "b" both are any two positive real numbers that are unequal to each other.

In an example, as illustrated in FIG. 2, the space 154 between two adjacent upper comb teeth 132 of the common electrode 11 and the space 153 between two adjacent upper comb teeth 131 of the pixel electrode 10 are unequal; and the space 156 between two adjacent lower comb teeth 142 of the common electrode 11 and the space 155 between two adjacent lower comb teeth 141 of the pixel electrode 10 are unequal.

For example, the space 154 between two adjacent upper comb teeth 132 of the common electrode 11 is the sum of the space between two upper comb teeth 13 for the common electrode 11 and the pixel electrode 10 adjacent to the common electrode 11 and the space between another two upper comb teeth 13 for the pixel electrode 10 and the common electrode 11 adjacent to the pixel electrode 10. The space 153 between two upper comb teeth 131 of two adjacent pixel electrodes 10 is the sum of the space between two upper comb teeth 13 for the pixel electrode 10 and the common electrode 11 adjacent to the pixel electrode 10 and the space between another two upper comb teeth 13 for the common electrode 11 and the pixel electrode 10 adjacent to the common electrode 11. The space 151 between two adjacent upper comb teeth 13 may be equal or may be unequal, but the space 154 between two adjacent upper comb teeth 132 of the common electrode 11 and the space 153 between two upper comb teeth 131 of the pixel electrode 10 are unequal. The space 156 between two lower comb teeth 142 of the common electrode 11 is the sum of the space between two lower comb teeth 14 for the common electrode 11 and the pixel electrode 10 adjacent to the common electrode 11 and the space between another two lower comb teeth 14 for the pixel electrode 10 and the common electrode 11 adjacent to the pixel electrode 10. The space 155 between two lower comb teeth 141 of the pixel electrode 10 is the sum of the space between two lower comb teeth 14 for the pixel electrode 10 and the common electrode 11 adjacent to the pixel electrode 10 and the space between another two lower comb teeth 14 for the common electrode 11 and the pixel electrode 10 adjacent to the common electrode 11. The space 152 between two adjacent lower comb teeth 14 may be equal or may be unequal, but the space 156 between lower comb teeth 142 of the common electrode 11 and the space 155 between lower comb teeth 141 of the pixel electrode 10 are unequal.

It is to be noted that, the space between two adjacent upper comb teeth may be equal or may be unequal, and the space between two adjacent lower comb teeth may be equal or may be unequal.

With reference to FIG. 5, the values of all the spaces 151 between adjacent upper comb teeth 13 are sequentially arranged in accordance with the cycle of the first space value, the second space value, the second space value, the first space value, . . . , and accordingly, the values of all the spaces 152 between adjacent lower comb teeth 14 are sequentially arranged in accordance with the cycle of the second space value, the first space value, the first space value, the second space value, . . . . Or, the values of all the spaces 151 between adjacent upper comb teeth 13 are sequentially arranged in accordance with the cycle of the first space value, the first space value, the second space value, the second space value, . . . and accordingly, the values of all the spaces 152 between adjacent lower comb teeth 14 are sequentially arranged in accordance with the cycle of the second space value, the second space value, the first space value, the first space value, . . . .

With reference to FIG. 5, according to the above example, the first space value is a, and the second space value is b. The values of all the spaces 151 between adjacent upper comb teeth 13 are successively, cyclically arranged in such an order of a, b, b, a; and accordingly, the values of all the spaces 152 between adjacent lower comb teeth 14 are successively, cyclically arranged in such an order of b, a, a, b. Or, the values of all the spaces 151 between adjacent upper comb teeth 13 are successively, cyclically arranged in such an order of a, a, b, b; and accordingly, the values of all the spaces 152 between adjacent lower comb teeth 14 are successively, cyclically arranged in such an order of b, b, a, a.

Hereinafter, the description will be given with reference to an example in which the values of all the spaces 151 between adjacent upper comb teeth 13 are successively, cyclically arranged in such an order of a, b, b, a; and accordingly, the values of all the spaces 152 between adjacent lower comb teeth 14 are successively, cyclically arranged in such an order of b, a, a, b, as illustrated in FIG. 5.

Regarding the common electrode 11 and the pixel electrode 10 adjacent to each other in a pixel unit of the array substrate, the last four spaces 151 between adjacent upper comb teeth 13 are in the cyclic arrangement to the last one space 151 between adjacent upper comb teeth 13 in an order 'a, b, b, a,' and can be exactly in a complete cycle; namely, the last four spaces between upper comb teeth 13 are a, b, b, a. Then accordingly, the last four spaces 152 between adjacent lower comb teeth 14 are in the cyclic arrangement to the last one space 152 between adjacent lower comb teeth 13 in an order 'b, a, a, b,' and can also be a complete cycle; namely, the last four spaces between lower comb teeth 14 are b, a, a, b. Certainly, the last four spaces 151 between adjacent upper comb teeth 13 are in the cyclic arrangement to the last one space 151 between adjacent upper comb teeth 13 in an order 'a, b, b, a,' and may not be in a complete cycle; namely, the last four spaces between upper comb teeth 13 are a, a, b, b; or b, a, a, b; or b, b, a, a; and accordingly, the last four spaces 152 between adjacent lower comb teeth 14 are in the cyclic arrangement to the last one space 152 between adjacent lower comb teeth 13 in an order 'b, a, a, b,' and may not be in a complete cycle, and they may be b, b, a, a; or a, b, b, a; or a, a, b, b.

It is to be noted that, the sequential arrangement in accordance with the cycle of 'the first space value, the second space value, the second space value, the first space value' stated above means that the values of all the spaces of the two upper comb teeth between the pixel electrodes and the common electrodes adjacent to each other are arranged in such an order of the first space value, the second space value, the second space value, the first space value; when the entire order is completed in arrangement, the arrangement will be restarted from one value of the entire order. For example, the space sequence from the first to the fourth spaces between upper comb teeth is the first space value, the second space value, the second space value, the first space value, then the space sequence from the fifth to the eighth spaces between upper comb teeth is the first space value, the second space value, the second space value, the first space value; afterwards, the consecutive, cyclical arrangement in such an order of the first space value, the second space value, the second space value, the first space value restart again.

Further, all junctions are regular junctions 16, and not all junctions are located on a same straight line. Or, all junctions are classified into regular junctions 16 and irregular junctions 17, and all junctions are located on a same straight line.

Figure 3:
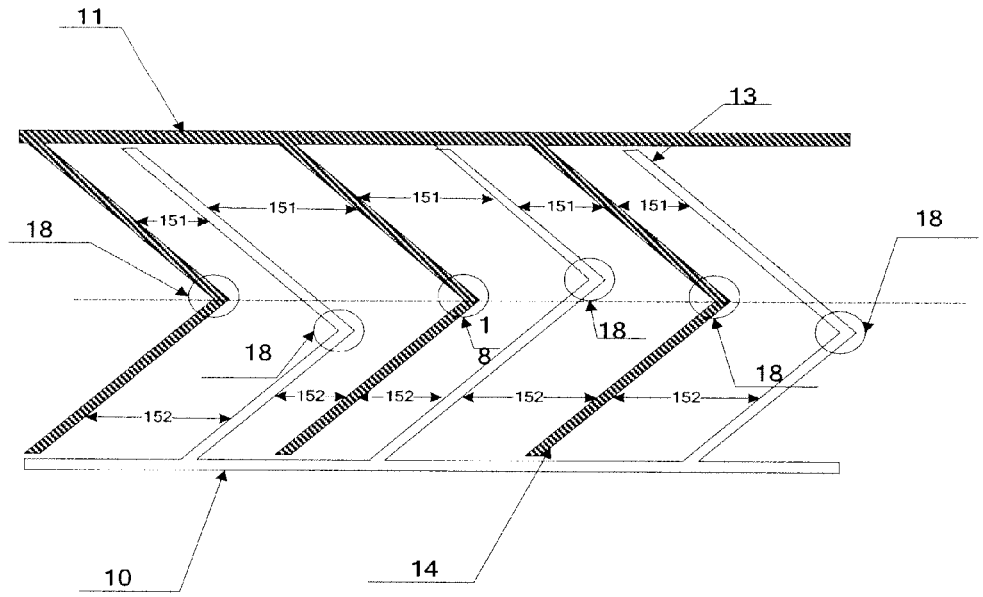
Figure 4:
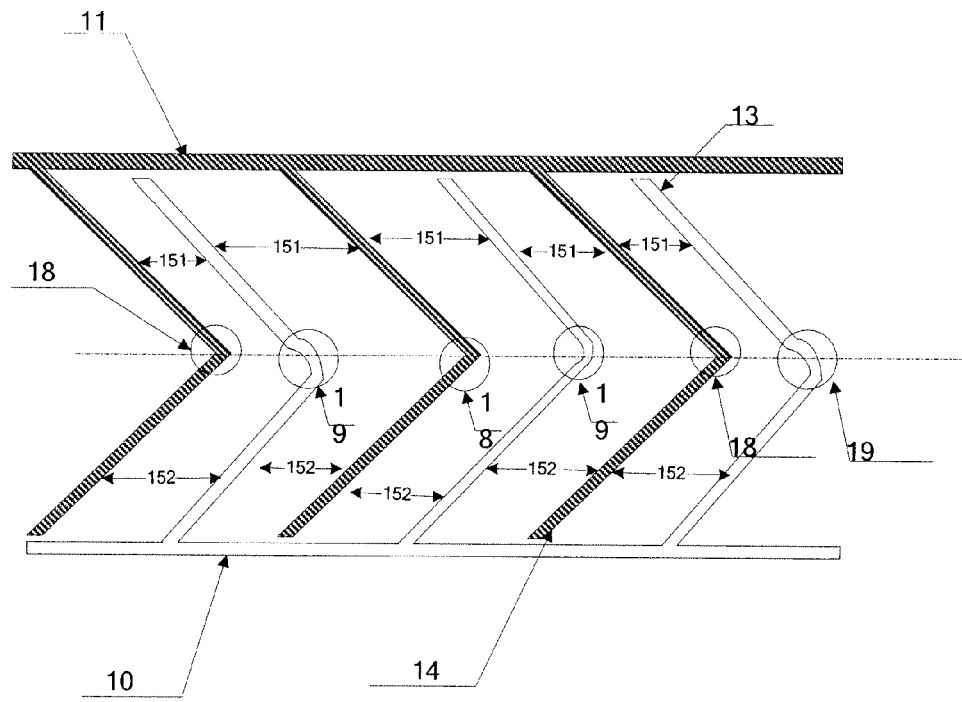
Figure 6:
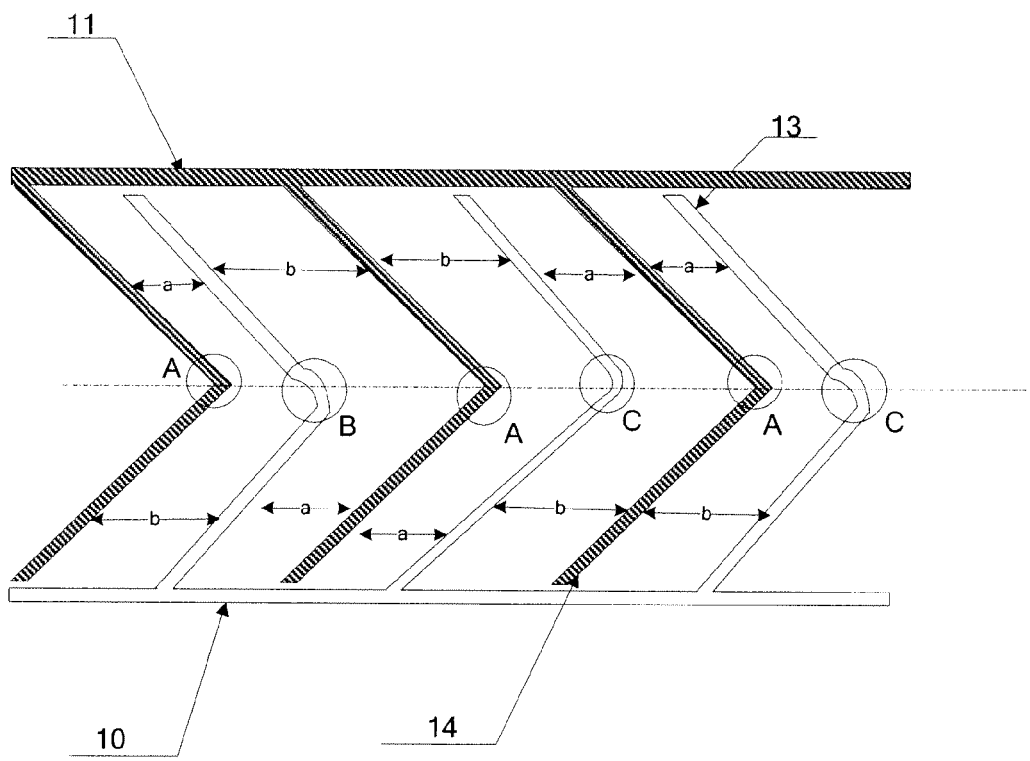
Figure 7:
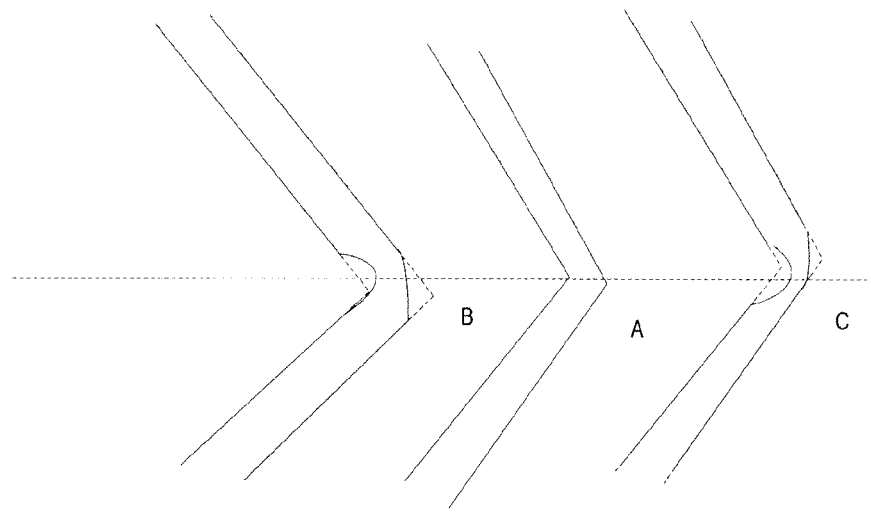

The space 151 between two upper comb teeth 13 is not equal to the space 152 between two lower comb teeth 14, and the space 154 between two adjacent upper comb teeth 13 of the common electrode 11 is not equal to the space 153 between two adjacent upper comb teeth 13 of the pixel electrodes 10; and the space 156 between two adjacent lower comb teeth 14 of the common electrode 11 is not equal to the space 155 between two adjacent lower comb teeth 14 of the pixel electrode 10. Thus, not all regular junctions 16 are located on a same straight line, as illustrated in FIG. 3. Certainly, on the premise that the above conditions are met, all junctions can be made to be located on a same straight line by producing a part of junctions to be irregular junctions 17, as illustrated in FIG. 4. For example, in accordance with the above example, the values of all the spaces 151 between adjacent upper comb teeth 13 are sequentially, cyclically arranged in an order of 'a, b, b, a,' and accordingly, the values of all the spaces 152 between adjacent lower comb teeth 14 are sequentially, cyclically arranged in an order of 'b, a, a, b.' All regular junctions can be classified into three types of A, B and C, and junctions of the three types are not located on a same straight line, as illustrated in FIG. 5. Of course, on the premise that the above conditions are met, if the position of an A-type junction is taken as a reference and positions of a B-type junction and a C-type junction are adjusted to be on a same straight line as position of the A-type junction, then it is necessary that the B-type junction and the C-type junction be processed to be irregular junctions, as illustrated in FIG. 6. As illustrated in FIG. 7, an irregular junction 17 is relatively narrow relative to a regular junction 16.

Here, the restriction that position of an A-type junction is taken as a reference is unnecessary, and the position of a B-type junction or the position of a C-type junction may also be taken as a reference. Embodiments of the invention do not set a limit to it.

It is to be noted that, in the case of a regular junction, an upper comb tooth or a lower comb tooth of a common electrode or a pixel electrode has a uniform width from top to down, and there is no a concave portion. In the case of an irregular junction, an upper comb tooth or a lower comb tooth of a common electrode or a pixel electrode is not uniform in width from top to down, and there is a concave portion. The narrowness as stated above means that a comb tooth of a common electrode or a pixel electrode where a junction is located is produced to be a comb tooth with a concave portion according to need, and the narrowness refers to the concave portion.

Figure 8:
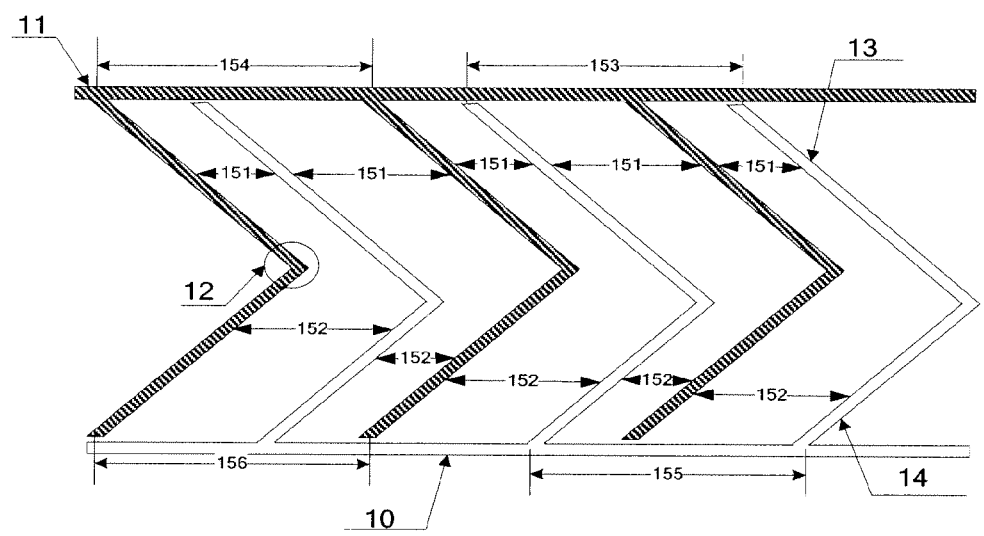

In another case, as illustrated in FIG. 8, the space 151 between two adjacent upper comb teeth 13 is unequal, and the space 152 between two adjacent lower comb teeth 14 is unequal.

The space 151 between two adjacent upper comb teeth 13 has two, unequal space values, and the space 152 between two adjacent lower comb teeth 14 has two, unequal space values as well.

Figure 9:
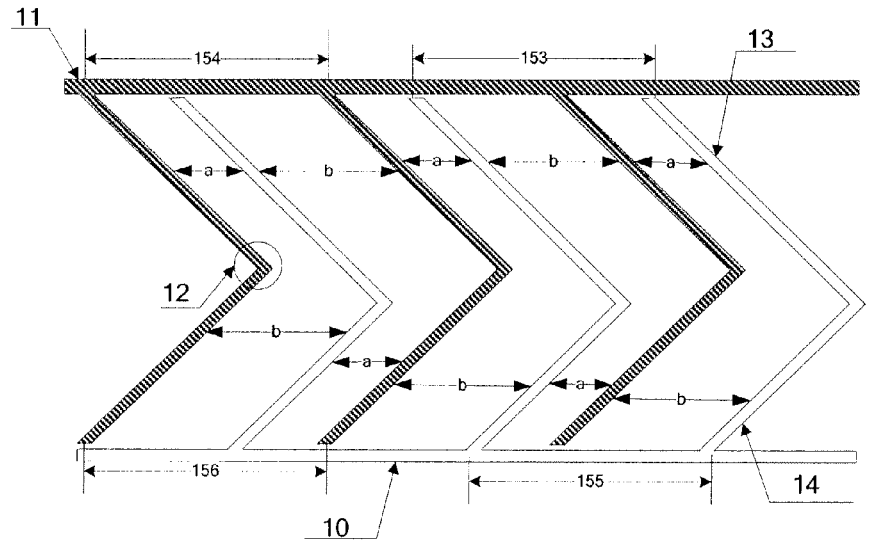

Further, as illustrated in FIG. 9, the space 154 between two adjacent upper comb teeth 13 of the common electrode 11 is equal to the space 153 between two adjacent upper comb teeth 13 of the pixel electrode 10. The space 156 between two adjacent lower comb teeth 14 of the common electrode 11 is equal to the space 155 between two adjacent lower comb teeth 14 of the pixel electrode 10.

The space 151 between two adjacent upper comb teeth 13 is unequal, but the space 154 between two adjacent upper comb teeth 13 of the common electrode 11 is equal to the space 153 between two adjacent upper comb teeth 13 of the pixel electrode 10; the space 152 between two adjacent lower comb teeth 14 is unequal, but the space 156 between two adjacent lower comb teeth 14 of the common electrode 11 is equal to the space 155 between two adjacent lower comb teeth 14 of the pixel electrode 10.

Preferably, with reference to FIG. 9, the values of all the spaces 151 between adjacent upper comb teeth 13 are successively arranged in accordance with the cycle of 'a first space value, a second space value'; and accordingly, the values of all the spaces 152 between adjacent lower comb teeth 14 are successively arranged in accordance with the cycle of 'the second space value, the first space value.'

With reference to FIG. 9, according to the above example, the first space value is a, the second space value is b, and the values of all the spaces 151 between adjacent upper comb teeth 13 are successively, cyclically arranged in an order of 'a, b.' Or, the values of all the spaces 152 between adjacent lower comb teeth 14 are successively, cyclically arranged in an order of 'b, a'.

Further, all junctions 12 are regular junctions 16, and not all the junctions 12 are located on a same straight line. Or, all junctions 12 are classified into regular junctions 16 and irregular junctions 17, and all the junctions 12 are located on a same straight line.

Figure 10:
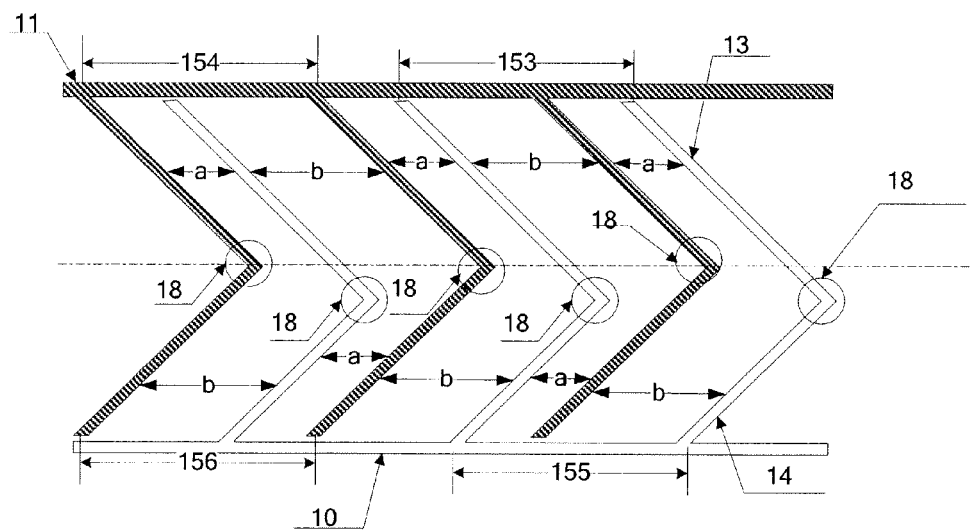
Figure 11:
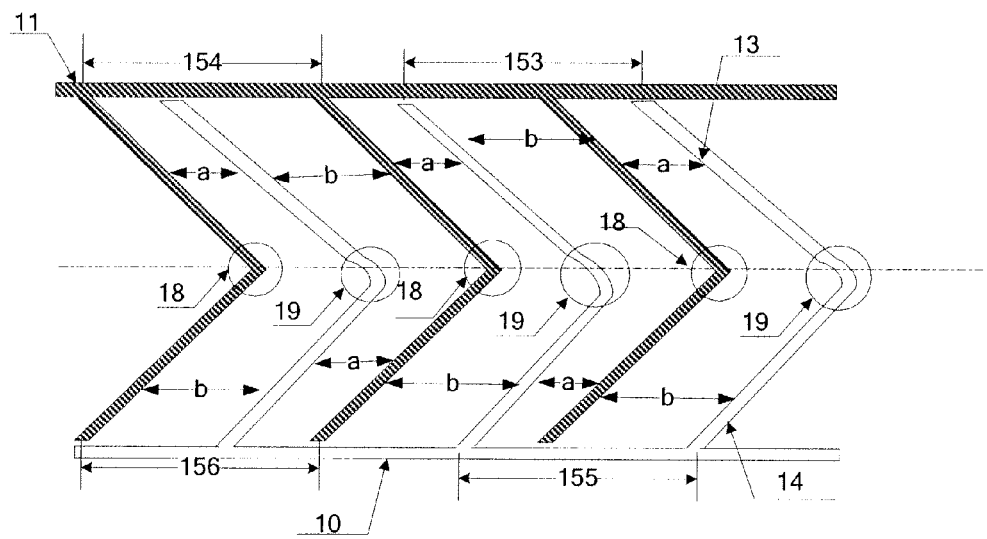

The space 151 between two upper comb teeth 13 is not equal to the space 152 between two lower comb teeth 14, and the space 154 between two adjacent upper comb teeth 13 of the common electrode 11 is not equal to the space 153 between two adjacent upper comb teeth 13 of the pixel electrode 10; and the space 156 between two adjacent lower comb teeth 14 of the common electrode 11 is not equal to the space 155 between two adjacent lower comb teeth 14 of the pixel electrode 10, and thus, not all the regular junctions 16 are located on a same straight line, as illustrated in FIG. 10. Certainly, on the premise that the above conditions are met, all junctions can be made to be located on a same straight line by producing a part of junctions to be irregular junctions 17, as illustrated in FIG. 11. With reference to FIG. 7, an irregular junction 17 is relatively narrow relative to a regular junction 16.

An array substrate provided by an embodiment of the invention has advantages of increased gradient of a V-T (voltage-transmittance) curve and contrast, fast response time, etc.

The simulation result for electrodes with 6/8 interval will be described below as an example.

The 6/8 interval represents that a first space value is 6 and a second space value is 8.

SIMPLE_6_8 represents an electrode design with two domains and 6/8 interval in the art of state, and will be called briefly as S_6_8 below. TWSIT_6_8 represents that a part of irregular junctions and a part of regular junctions of electrode in an embodiment of the invention are located on a same straight line, and will be called briefly as T_6_8. No_line_6_8 represents that all regular junctions of electrode in an embodiment of the invention are not located on a same straight line, and will be called briefly as N_6_8.

The simulation result of an increased contrast is as follows.

|  | S_6_8 | T_6_8 | N_6_8 |
| --- | --- | --- | --- |
| CR(max) | 25047.6 | 24925.5 | 25308.1 |

As can be seen from the above, the maximum value of contrast in the embodiments of the invention is 25308.1, while the maximum value of contrast for an electrode S_6_8 with two domains and 6/8 interval in the art of state is 25047.6. The embodiments of the invention have advantages of increasing the contrast and are better than those in the art of state.

The simulation results of reduced chromatic aberration can be seen by comparison among various gamut values, and the comparison results are shown as follows.

S_6_8−T_6_8=2.37,
N_6_8−T_6_8=2.09,
S_6_8−N_6_8=0.28.

As can be seen from the above, the difference between the gamut value of S_6_8 in the art of state and the gamut value of T_6_8 is 2.37; the difference between the gamut value of N_6_8 and the gamut value of T_6_8 is 2.09; and the difference between the gamut value of S_6_8 in the art of state and the gamut value of N_6_8 is 0.28. As can be seen from the above difference results, the comparison results of various gamut values are S_6_8>N_6_8>T_6_8. Thus, embodiments of the invention have an advantageous of reducing the chromatic aberration, and the effect is better than that in the art of state.

Figure 12:
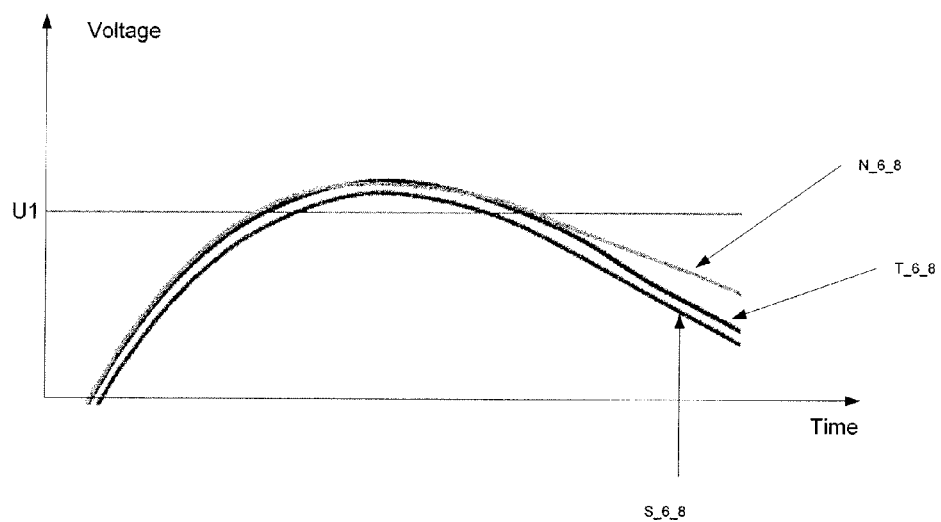
FIG. 12 is a schematic diagram showing the simulation result of a V-T (voltage-transmittance) curve with an increased gradient provided by an embodiment of the invention.

The simulation results for an increased gradient of a V-T (voltage-transmittance) curve are illustrated in FIG. 12.

As can be seen from FIG. 12, in the case of T_6_8 where a part of irregular junctions and a part of regular junctions of electrode in an embodiment of the invention are located on a same straight line and in the case of N_6_8 where all regular junctions of electrode are not located on a same straight line, the used time is fewer until reaching the maximum value U1 of transmittance at a certain voltage value, and the required voltage is smaller, compared with the electrode S_6_8 with two domains and 6/8 interval in the art of state. The highest voltage value in the two cases of T_6_8 and N_6_8 of the invention is larger than the highest voltage value for S_6_8 in the art of state, and in the two cases of T_6_8 and N_6_8 of the invention, the lasting span from a certain transmittance value to the maximum value of transmittance at a voltage is longer compared with S_6_8 in the art of state. Thus, the embodiments of the invention have an advantage of increasing gradient of a V-T (voltage-transmittance) curve, and the effect is better than that in the art of state.

Figure 13:
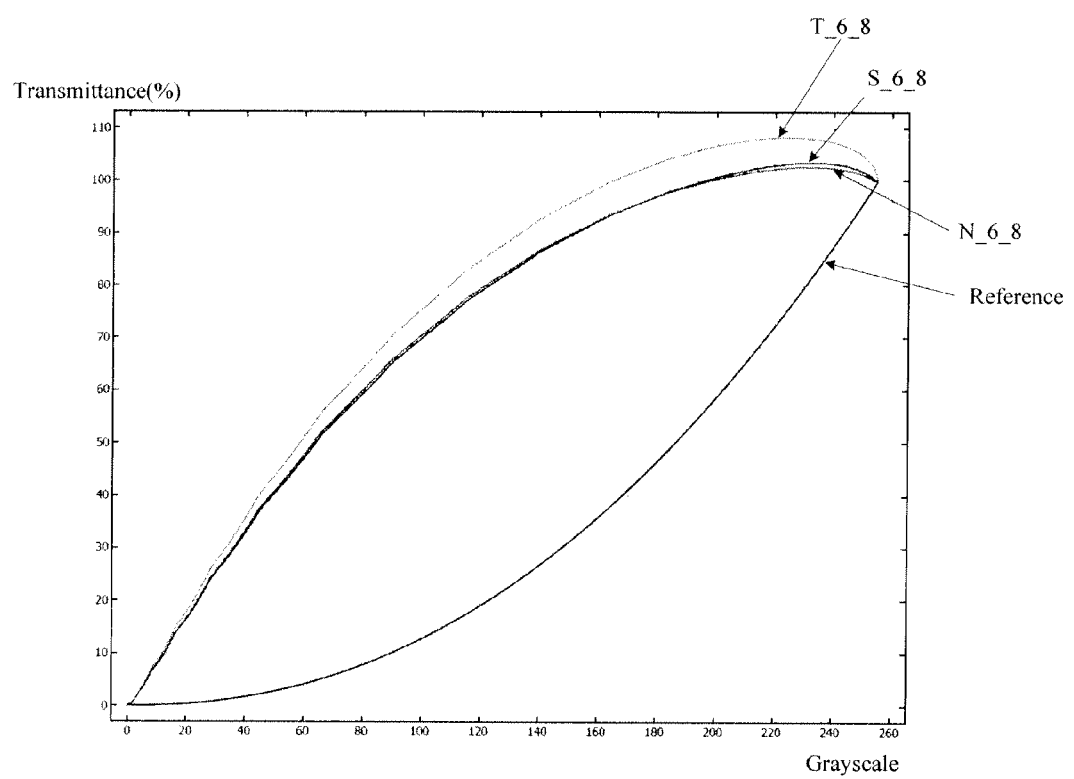
FIG. 13 is a schematic diagram showing the simulation result of an improved transmittance-grayscale provided by an embodiment of the invention.

The simulation results for improved transmittance-grayscale are illustrated in FIG. 13.

As can be seen from FIG. 13, in the case of T_6_8 where a part of irregular junctions and a part of regular junction of electrode in an embodiment of the invention are located on a same straight line, the effect of improving the transmittance-grayscale is better; and in terms of improving transmittance-grayscale, the case of T_6_8 where all regular junctions of electrode in an embodiment of the invention are not located on a same straight line has substantially the same effect of improving transmittance-grayscale as the electrode S_6_8 with two domains and 6/8 interval in the art of state. The embodiments of the invention have an advantage of improving transmittance-grayscale, and the effect is better than that in the art of state.

The embodiments of the invention also have advantages of improving the distort offset and the like, and descriptions will not be made any more here by enumerating all simulation results.

It is to be noted that, for each embodiment of the invention, the simulation is compared with the electrode S_6_8 with two domains and 6/8 interval in the art of state. This is because that in the art of state, the electrode S_6_8 with two domains and 6/8 interval is more universal than electrode S_6_8 with four domains and 6/8 interval, and the simulation result is more persuasive.

According to an embodiment of the invention, there is further provided a liquid crystal display device, comprising an array substrate and a counter substrate (e.g., a color filter substrate), and the array substrate is the above-mentioned array substrate.

It is to be noted that, the liquid crystal display device may be a liquid crystal display panel, a liquid crystal display, and the invention is not limited thereto.

An array substrate and a liquid crystal display device are provided by embodiments of the invention. A new four-domain electrode structure is provided by arranging a common electrode and a pixel electrode to have a comb-shaped structure, in which the comb teeth of the common electrode and the comb teeth of the pixel electrode are disposed alternately, each comb tooth is divided into an upper comb tooth and a lower comb tooth at a junction, all the upper comb teeth are parallel to each other, all the lower comb teeth are parallel to each other, and for a pixel electrode and a common electrode that are adjacent, the space between two upper comb teeth is not equal to the space between two lower comb teeth. The array substrate and the liquid crystal display device containing this new four-domain electrode structure have an increased gradient of a V-T (voltage-transmittance) curve, contrast, relatively ideal response time and other advantages.

The descriptions made above are merely exemplary embodiments of the invention, but are not used to limit the protection scope of the invention. The protection scope of the invention is defined by attached claims.

The invention claimed is:

1. An array substrate, comprising: a plurality of gate lines, a plurality of data lines and a plurality of pixel units defined by the gate lines and the data lines;
wherein each of the pixel units comprises a pixel electrode and a common electrode that are provided on a same layer; the common electrode and the pixel electrode each have a comb-shaped structure, and comb teeth of the common electrode and comb teeth of the pixel electrode are disposed alternately; each comb tooth of the comb-shaped structure is divided into an upper comb tooth and a lower comb tooth in different directions at a junction, and all of upper comb teeth are parallel to one another, all of lower comb teeth are parallel to one another;
for the pixel electrode and common electrode that are adjacent, a space between two upper comb teeth and a space between two lower comb teeth are unequal.

2. The array substrate according to claim 1, wherein a space between two adjacent upper comb teeth of the common electrode is not equal to a space between two adjacent upper comb teeth of the pixel electrode; and a space between two adjacent lower comb teeth of the common electrode is not equal to a space between two adjacent lower comb teeth of the pixel electrode.

3. The array substrate according to claim 1, wherein the spaces between two adjacent upper comb teeth are unequal, and the spaces between two adjacent lower comb teeth are unequal.

4. The array substrate according to claim 3, wherein a space between two adjacent upper comb teeth of the common electrode is not equal to a space between two adjacent upper comb teeth of the pixel electrode; a space between two adjacent lower comb teeth of the common electrode is not equal to a space between two adjacent lower comb teeth of the pixel electrode.

5. The array substrate according to claim 1, wherein the space between two upper comb teeth being not equal to the space between two lower comb teeth specifically comprises: the space between two upper comb teeth has a first space value, the space between two lower comb teeth has a second space value; or, the space between two upper comb teeth has the second space value, the space between two lower comb teeth has the first space value; and
wherein the first space value and the second space value are unequal.

6. The array substrate according to claim 5, wherein values of all the spaces between adjacent upper comb teeth are sequentially arranged in accordance with a cycle of 'the first space value, the second space value, the second space value, and the first space value', and accordingly, values of all the spaces between adjacent lower comb teeth are sequentially arranged in accordance with a cycle of 'the second space value, the first space value, the first space value, the second space value'; or,
the values of all the spaces between adjacent upper comb teeth are sequentially arranged in accordance with a cycle of 'the first space value, the first space value, the second space value, the second space value', and accordingly, the values of all the spaces between adjacent lower comb teeth are sequentially arranged in accordance with a cycle of 'the second space value, the second space value, the first space value, the first space value'.

7. The array substrate according to claim 5, wherein values of all the spaces between adjacent upper comb teeth are sequentially arranged in accordance with a cycle of 'the first space value, the second space value', and accordingly, values of all the spaces between adjacent lower comb teeth are sequentially arranged in accordance with a cycle of 'the second space value, the first space value'.

8. The array substrate according to claim 1, wherein all junctions are regular junctions, and not all the junctions are located on a same straight line; or
all junctions are classified into regular junctions and irregular junctions, and all the junctions are located on a same straight line.

9. The array substrate according to claim 8, wherein the irregular junctions are narrower than the regular junctions.

10. A liquid crystal display device, comprising the array substrate according to claim 1.

* * * * *